United States Patent
Tabara

(10) Patent No.: US 6,197,689 B1
(45) Date of Patent: Mar. 6, 2001

(54) SEMICONDUCTOR MANUFACTURE METHOD WITH ALUMINUM WIRING LAYER PATTERNING PROCESS

(75) Inventor: Suguru Tabara, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 08/985,482

(22) Filed: Dec. 4, 1997

(30) Foreign Application Priority Data

Dec. 4, 1996 (JP) ................................. 8-324238

(51) Int. Cl.$^7$ ................. H01L 21/44; H01L 21/302; H01L 21/461

(52) U.S. Cl. .................... 438/688; 438/669; 438/706; 438/734

(58) Field of Search ................. 438/688, 706, 438/735, 734, 742, 720, 606, 710, 714, 738, 669

(56) References Cited

U.S. PATENT DOCUMENTS

| | | | |
|---|---|---|---|
| 3,522,118 | * 7/1970 | Taylor | 156/17 |
| 3,994,793 | * 11/1976 | Havilchuck et al. | 204/192 |
| 5,387,556 | * 2/1995 | Xiaobing et al. | 437/228 |
| 5,397,433 | * 3/1995 | Gabriel | 156/665 |
| 5,776,832 | * 7/1998 | Hsieh et al. | 438/669 |
| 5,801,101 | * 9/1998 | Miyoshi | 438/714 |
| 5,827,437 | * 10/1998 | Yang et al. | 216/77 |
| 5,843,848 | * 12/1998 | Yanagawa | 438/738 |
| 5,846,885 | * 12/1998 | Kamata et al. | 438/729 |
| 5,976,986 | * 11/1999 | Naeem et al. | 438/714 |

FOREIGN PATENT DOCUMENTS

| | | |
|---|---|---|
| 6-295886 | 10/1994 | (JP) . |
| 8-130206 | 5/1996 | (JP) . |

\* cited by examiner

*Primary Examiner*—Charles Bowers
*Assistant Examiner*—Thanhha Pham

(57) ABSTRACT

A method of manufacturing a semiconductor device includes: a step of forming a conductive layer on a semiconductor substrate, the conductive layer being made of aluminum or aluminum alloy; a step of forming a resist pattern on the conductive layer, the resist pattern having an opening pattern including a narrow space having a high aspect ratio and an open space having a low aspect ratio; a main etching step of dry-etching the conductive layer by using the resist mask as an etching mask, wherein the conductive layer is almost etched in the open space having the low aspect ratio and not fully etched in the narrow space having the high aspect ratio; and an over etching step of further dry-etching the conductive layer by using the resist mask as an etching mask and by using as etchant a mixed gas of HCl gas and at least one species of gas selected from the group consisting of He, Ar, Ne and $H_2$. The proposed method provides a process of etching an aluminum containing conductive layer at high patterning precision and with high reliability while suppressing electron shading damages.

11 Claims, 7 Drawing Sheets

RESIST SELECTION RATIO
$$= \frac{d(Al)}{d(res)}$$

NOTCH
$= Wtop - Wb$

SEMICONDUCTOR MANUFACTURE METHOD WITH ALUMINUM WIRING LAYER PATTERNING PROCESS

This application is based on Japanese Patent Application No. 8-324238 filed on Dec. 4, 1996, the entire contents of which are incorporated herein by reference.

BACKGROUND OF THE INVENTION a) Field of the Invention

The present invention relates to a semiconductor device manufacture method, and more particularly to a semiconductor device manufacture method with a process of patterning an aluminum containing wiring layer.

b) Description of the Related Art

Several methods are known for dry etching an aluminum containing wiring layer. Some of these methods will be described in the following. In this specification, "aluminum containing" is intended to mean aluminum or aluminum alloy.

In the first method, an aluminum containing conductive layer formed on a semiconductor substrate is etched by plasma of a mixed gas of $BCl_3$ and $Cl_2$ by using a resist pattern or the like as a mask. Both $BCl_3$ and $Cl_2$ produce Cl species in plasma. Cl species chemically react with an aluminum containing conductive layer and form volatile $AlCl_3$ having a high vapor pressure. Dry etching of aluminum containing material is performed by evaporation and removal of $AlCl_3$.

In the second method in JP-A-8-130206, as described, for example, aluminum containing material which also contains silicon deposited on a semiconductor substrate is etched by plasma of HCl gas. After main etching of an open space which is an opening having a low aspect ratio, aluminum containing material which also contains silicon and left in a narrow space which is an opening having a high aspect ratio is over-etched by increasing a flow rate of HCl gas.

An aspect ratio is defined as a fraction having a width as a denominator and a height as a numerator. Assuming that an opening has a constant height, the lower the aspect ratio, the broader the opening (open space), and the higher the aspect ratio, the narrower the opening (narrow space).

In the third method as disclosed in JP-A-6-295886, an aluminum containing conductive layer is dry etched by plasma of a mixed gas of HCl gas, chlorine containing gas (excepting HCl) such as $Cl_2$, and $N_2$ gas.

In order to make a semiconductor device highly integrated, it is necessary to layout wiring patterns densely. In order to lower the resistance of densely disposed wiring patterns, the height of each pattern is increased to have a larger cross sectional area of the wiring pattern. Etching an opening having a high aspect ratio is therefore necessary.

In the manufacture of semiconductor integrated circuit devices, high integration (fine patterning) and large diameter of semiconductor wafers are becoming common. With such technical advancements, low pressure and high density plasma is becoming a requisite for semiconductor fine processing techniques. In such plasma processing, efforts have been made to balance positive and negative charges of plasma in order to avoid adverse effects of charges injected from the plasma into a semiconductor substrate.

However, even if plasma having a uniform charge distribution on a flat surface is used, it is reported that charging damages peculiar to high density plasma, called electron shading damages, are formed if a resist mask is used which has an opening (narrow space) with a high aspect ratio.

In this specification, "electron shading damages" are intended to mean damages caused by excessive injection of positive charges in a conductive layer surface because electrons are shielded (shaded).

Electron shading damages are presumably formed by a motion difference between electrons and ions. Generally, a bias potential is generated between a semiconductor substrate and plasma so that ions having positive charges are incident upon the substrate while they are accelerated. In contrast, electrons having negative charges are decelerated by the electric field. As a result, ions are incident upon the substrate generally vertically, whereas electrons are incident upon the substrate obliquely with a large velocity component in the directions in parallel to the substrate surface.

If an insulating pattern is placed on the surface of a conductive material to be etched, obliquely incoming electrons are intercepted by the insulating pattern. However, vertically incoming ions are not intercepted by such an insulating pattern and are vertically incident upon the surface of the conductive material. From these reasons, excessive positive charges flow into the conductive material surface.

As electrons are captured in the side wall of the insulating pattern, an electric field is formed which repulses incident electrons. Most of electrons having a small kinetic energy in the vertical direction are repulsed or repelled. Electron shading damages are presumed to be formed in the manner described above.

Ions having positive charges are rather attracted by such an electric field and are assisted to enter the conductive material surface under the insulating pattern. If the conductive layer is electrically insulated from the substrate, positive charges are accumulated in the conductive layer under the insulating pattern. If the conductive layer is connected to an insulated gate electrode, an electric field is applied across the gate insulating film. If tunneling current flows through the gate insulating film by this electric field, it is supposed that positive charges accumulated in the conductive layer take a steady state. The gate insulating film is deteriorated by the tunneling current.

If the gate insulating film is thick, tunneling current is hard to flow therethrough. Therefore, the amount of positive charges accumulated in the conductive layer becomes large and an electric field is generated which attracts electrons to the surface of the conductive layer. As electrons are attracted by this electric field, this state becomes a steady state even if tunneling current does not flow.

As MOS transistors are made finer, the gate oxide film tends to become thinner. As the gate insulating film becomes thin, tunneling current becomes easy to flow and the lifetime of the gate insulating film is shortened by the tunnelling current caused by electron shading.

The first method using $BCl_3/Cl_2$ forms electron shading damages if high density plasma is used.

The second method using two steps of etching by HCl forms a notch at the bottom of an etched aluminum containing wiring pattern on the substrate side, i.e., the cross section of the pattern is contracted at the bottom thereof (the line width is narrowed).

The third method using $HCl/Cl_2/N_2$ is likely to form residue if $N_2$ is added too much, or is likely to form side-etch if the amount of $Cl_2$ is large and $N_2$ is small. The residue may result in electrical short between wiring patterns or low reliability of wiring, and the side-etch may result in low patterning precision.

SUMMARY OF THE INVENTION

It is an object of the present invention to provide a semiconductor device manufacture method including a process of etching an aluminum containing conductive layer at high patterning precision and with high reliability while suppressing electron shading damages.

According to one aspect of the present invention, there is provided a method of manufacturing a semiconductor device comprising the steps of: forming a conductive layer on a semiconductor substrate, the conductive layer being made of aluminum or aluminum alloy; forming a resist pattern on the conductive layer, the resist pattern having an opening pattern including a narrow space having a high aspect ratio and an open space having a low aspect ratio; mainly etching by dry-etching the conductive layer, using the resist mask as an etching mask, wherein the conductive layer is almost etched in the open space having the low aspect ratio and not fully etched in the narrow space having the high aspect ratio; and excessively etching by further dry-etching the conductive layer, using the resist mask as an etching mask and using as etchant a mixed gas of HCl gas and at least one species of gas selected from the group consisting of He, Ar, Ne and $H_2$.

Electron shading damages can be reduced by using an etchant gas having a low average molecular weight in the over etching step.

DETAILED DESCRIPTION OF THE PREFERRED EMBODIMENTS

The invention will be described in connection with preferred embodiments.

Figure 1A:
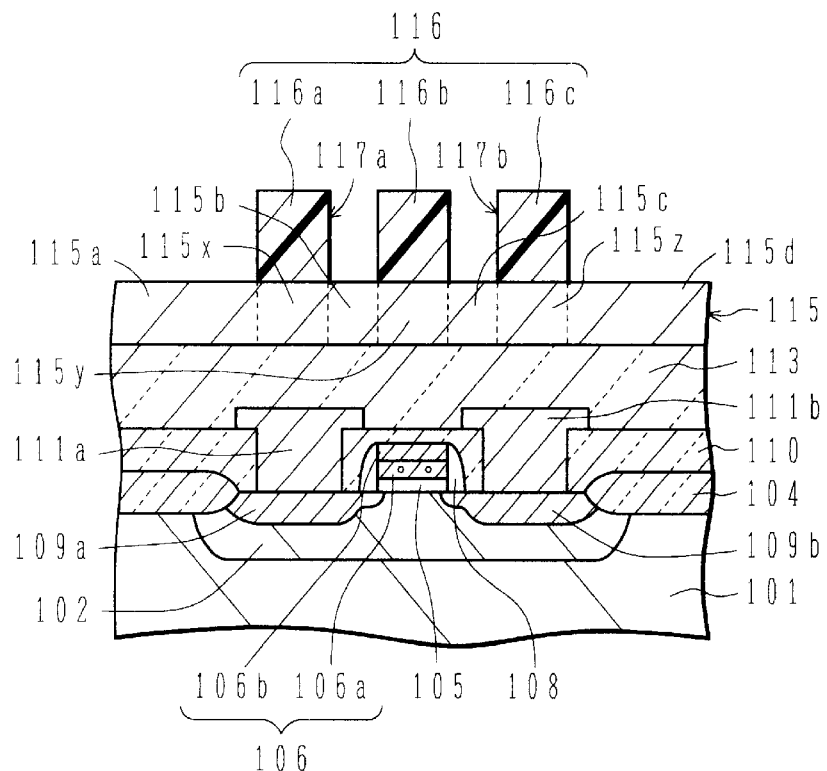
FIGS. 1A and 1B are a cross sectional view of a semiconductor substrate and a flow chart of an etching process, illustrating a fundamental embodiment of the invention.
Figure 1B:
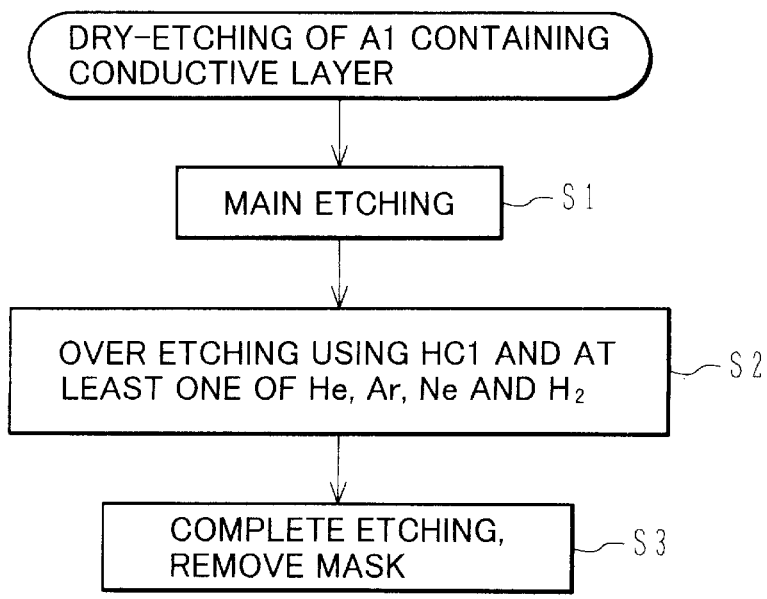

FIG. 1A is a cross sectional view showing an example of a semiconductor substrate before etching, and FIG. 1B is a flow chart illustrating a dry etching process for an aluminum containing conductive layer according to a fundamental embodiment of the invention.

Referring to FIG. 1A, the surface region of a semiconductor substrate 101 has a p-type well 102 formed therein. A field insulating film 104 formed by well known local oxidation of silicon (LOCOS) defines an active region in the surface layer of the semiconductor substrate 101. An insulated gate electrode structure is formed on the surface of the active region, the insulated gate electrode structure being constituted of a gate oxide film 105, a polysilicon gate electrode 106a and a silicide layer 106b formed on the active region surface in this order from the bottom.

Instead of the gate electrode 106 made of the polysilicon gate electrode 106a and silicide electrode 106b, a gate electrode made of only a single polysilicon layer or other gate electrodes may be used. Side spacer oxide regions 108 are formed on the side walls of the gate electrode 106. Source/drain regions 109a and 109b doped with n-type impurities by ion implantation or the like are formed on both sides of the gate electrode 106. An insulating film 110 of silicon oxide or the like covers the gate electrode over the semiconductor substrate 1, the insulating film 110 having contact holes formed therethrough above the source/drain regions 109a and 109b. Source/drain electrodes 111a and 111b are electrically connected to the source/drain regions 109a and 109b via the openings.

An interlayer insulating film 113 of silicon oxide or the like covers the source/drain electrodes 111a and 111b. The surface of the interlayer insulating film 113 is flat. The interlayer insulating film 113 has an aluminum containing conductive layer 115 formed thereon, on which layer 115 a resist pattern 116 is formed. The resist pattern 116 has patterns 116a, 116b and 116c disposed in close proximity to each other.

By using this resist pattern 116 as an etching mask, the aluminum containing conductive layer 115 is dry etched. At the time when the dry etching is finished, aluminum containing conductive layer patterns 115x, 115y and 115z are left under the resist patterns 116a, 116b and 116c. More specifically, of the aluminum containing conductive layer 115, all etched and removed are aluminum containing conductive layers 115b and 115c under a narrow space 117a between the resist patterns 116a and 116b and under a narrow space 117b between the resist patterns 116b and 116c, and aluminum containing conductive layers 115a and 115d under an open space.

In this etching, the etching rate in the broad open space is different from that in the narrow space. Even if the etching in the open space is finished, the etching in the narrow space is not still completed. A change in the etching rate dependent upon the aspect ratio at an opening is called micro loading effects.

The narrow and open spaces are redefined as in the following. An opening having a high aspect ratio with an etching rate lowered by the micro loading effects is called a narrow space, whereas an opening having a low aspect ratio with an etching rate not lowered without being affected by the micro loading effects is called an open space. Such a critical aspect ratio is, for example, 1.

An etching process of etching a conductive layer in an open space is called a main etching process, and an etching process performed after the main etching and fully etching the conductive layer in a narrow space is called an over etching process. Dry etching in an opening having an aspect ratio of 1 or smaller is hardly affected by the micro loading effects. Therefore, an opening having an aspect ratio of 1 or smaller can be called an open space.

As illustrated in FIG. 1B, dry etching of an aluminum containing conductive layer is performed by two steps. As the etching starts, the main etching is first performed at Step S1. Etchant gas of the main etching is not limited specifically.

In succession of the main etching, the over etching is performed at Step S2. The over etching uses as etchant gas a mixed gas of HCl and at least one type of gas selected from the group consisting of He, Ar, Ne and $H_2$. By using such a mixed gas, the over etching is performed to complete the dry etching of the Al containing conductive layer. After the dry etching is completed, the resist mask used for the etching is removed at Step S3.

With the above dry etching, it is possible to etch an aluminum containing conductive layer at high patterning precision and with high reliability while suppressing electron shading damages.

A method of measuring electron shading damages will be described.

Of constituent elements of a semiconductor integrated circuit device, the gate oxide film of a MOS transistor is generally most affected by electron shading damages. If the gate electrode is connected to a wiring pattern at a higher level layer, electric charges injected when the higher level layer is etched concentrate upon the gate electrode to cause tunneling current to flow through the gate oxide film. The lifetime of the gate electrode is generally determined by the cumulative amount of tunneling current flowed therethrough. It is therefore important to know the cumulative value of tunneling current flowed through the gate oxide film during manufacture processes.

Figure 2A:
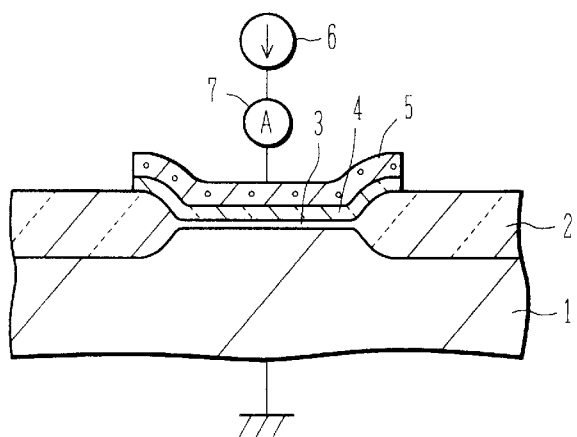
FIGS. 2A to 2C are a cross sectional view of a sample used by a method of measuring electron shading damages and graphs showing the measurement results.
Figure 2B:
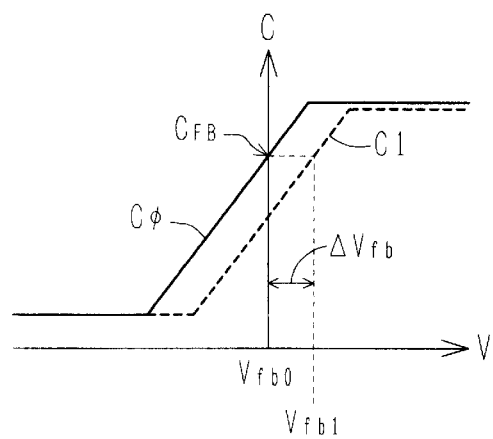
Figure 2C:
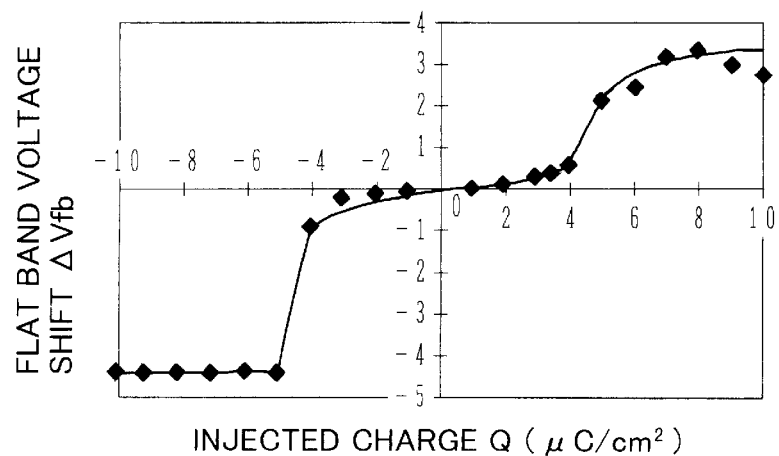

FIGS. 2A to 2C illustrate preliminary experiments which are performed before monitoring actual manufacture processes. FIG. 2A illustrates a sample used with preliminary experiments and a process of applying current stress to the sample. FIG. 2B is a graph briefly showing the C-V measurement results of the sample after current stress is applied. FIG. 2C is a graph showing a change in a flat band voltage $V_{fb}$ relative to an injected charge amount Q, the graph being obtained through preliminary experiments.

As shown in FIG. 2A, on the surface of an n-type Si substrate 1, a field oxide film 2 is formed to a thickness of, for example, about 400 nm by LOCOS. An oxide film 3 is formed through thermal oxidation on the surface of an active region defined by the field oxide film 2, to a thickness of, for example, about 2 nm. A nitride film of, for example, about 100 nm thick is grown on the oxide film 3 by CVD. For example, an area of the oxide film 3 is about 100 $\mu$m×100 $\mu$m.

An electrode 5 of polysilicon is grown on the nitride film 4 by CVD. The electrode 5 corresponds to an insulated gate and has a thickness of, for example, about several hundreds nm. This thickness is not mandatory so long as low resistance of the electrode is ensured. Instead of a polysilicon electrode, a polycide electrode of a lower polysilicon layer and an upper silicide layer may be used. A lamination of the electrode 5 and nitride film 4 is patterned to form a sample to be measured.

First, the capacitance of the sample shown in FIG. 2A is measured as a function of an applied voltage to obtain C-V characteristics. For example, this C-V measurement is performed at a frequency of 1 MHz and at a voltage of −5 V to +5 V.

A flat band voltage $V_{fb}$ is defined as a gate voltage $V_g$ at which the capacitance of the measured MNOS capacitor becomes equal to a flat band capacitance $C_{FB}$ of a MIS (Metal-Insulator-Semiconductor) capacitor given by the following equation (1).

$$C_{FB} \epsilon i / \{d + (\epsilon i/\epsilon s)(kT\epsilon s/ni/q^2)^{1/2}\} \quad (1)$$

where d is a thickness of an insulating film, $\epsilon i$ is a dielectric constant of the insulating film, $\epsilon s$ is a dielectric constant of a semiconductor substrate, and ni is an intrinsic carrier density. An initial flat band voltage is represented by $V_{fb0}$ in FIG. 2B.

The n-type Si substrate 1 is grounded and the Si electrode 5 is used as a positive pole. Current is flowed from a constant current source 6 and monitored with an ammeter 7 connected to the constant current source 6. For example, the ammeter 7 is formed by a standard resistor and a voltage meter measuring a voltage across the standard resistor. Another sample was also prepared for applying current stress of an opposite polarity by using the electrode 5 as the negative pole.

As current is flowed from the constant current source 6 to the MNOS capacitor constituted of the Si electrode 5, nitride film 4, oxide film 3 and n-type Si substrate 1, tunneling current flows through the nitride film 4 and oxide film 3. The oxide film 3 is therefore damaged by this tunneling current. The damage caused by the tunneling current can be estimated from the charge amount flowed through the oxide film 3, i.e., the cumulative value of tunneling current flowed through the ammeter 7. After current stress is applied, C-V measurement is again performed.

FIG. 2B is a graph briefly showing the C-V measurement results. The C-V characteristics before stress application are indicated by a curve C0, and the C-V characteristics after stress application are indicated by a curve C1. The flat band voltage of the C-V characteristics after stress application is represented by $V_{fb1}$. The current stress application shifted the flat band voltage by $\Delta V_{fb}$. This flat band voltage shift amount $\Delta V_{fb}$ was obtained as a function of charge amount supplied from the constant current source 6.

FIG. 2C shows the flat band voltage shift $\Delta V_{fb}$ as a function of injected charge Q. The abscissa represents the injected charge amount Q ($\mu$C/cm$^2$) and the ordinate represents the flat band voltage shift amount $\Delta V_{fb}$. If the thickness of the nitride film 4 is reduced, the measurement voltage range is narrowed.

After the flat band voltage shift amount $\Delta V_{fb}$ as a function of injected charge amount Q is once obtained, a subject process is performed by using another sample having the same structure to measure the flat band voltage shift amount. The charge amount flowed through the oxide film during this subject process can be known from the measured flat band voltage shift amount with reference to the graph shown in FIG. 2C.

Figure 3A:
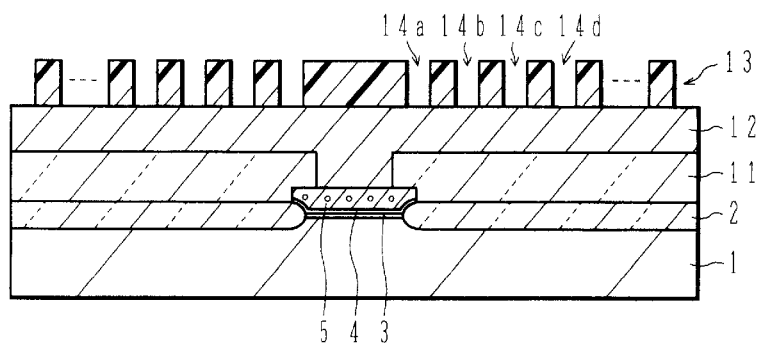
FIGS. 3A to 3C and FIGS. 4A to 4C are cross sectional views and plan views showing the structure of samples used by a method of measuring electron shading damages.
Figure 3B:
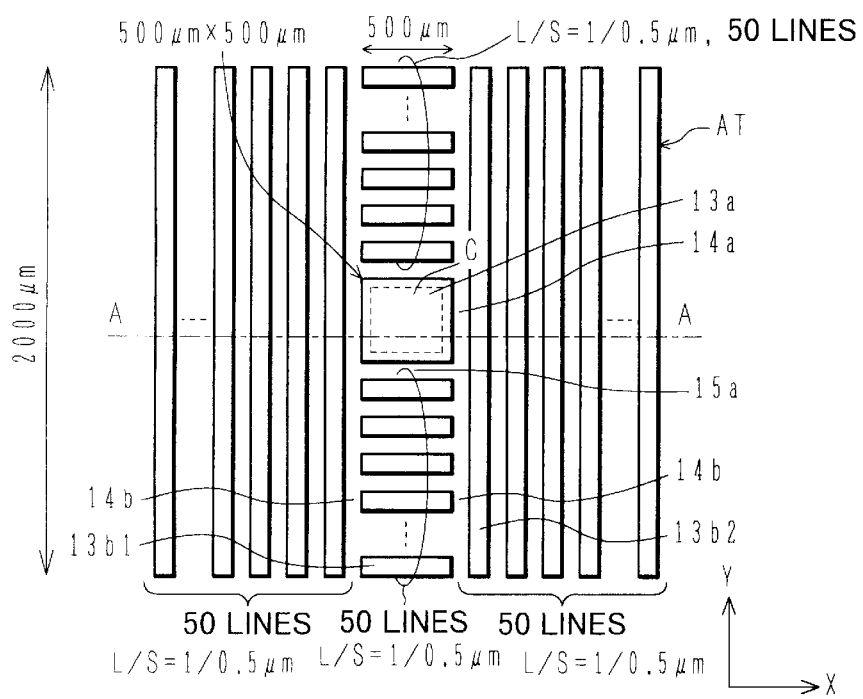
Figure 3C:
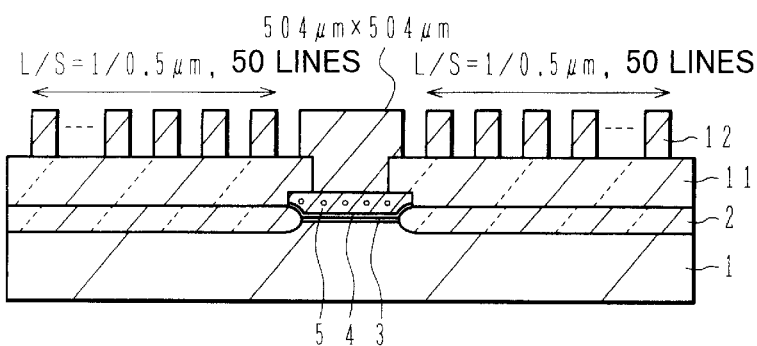

FIGS. 3A to 3C show the structure of a sample used for monitoring a process.

Referring to FIG. 3A, an n-type Si substrate 1 is formed with a field oxide film 2, an oxide film 3, a nitride film 4, and an electrode 5. This structure is the same as the current stress measurement sample shown in FIG. 2A. The MNOS capacitor structure is annealed for 30 minutes at 400° C. in an O$_2$/N$_2$ atmosphere to avoid any influence of the etching process performed for the electrode 5. Thereafter, an initial C-V measurement is performed to obtain an initial flat band voltage.

Thereafter, an insulating film 11 having a thickness of, for example, 500 nm is formed by CVD or the like, the insulating film 11 covering the MNOS capacitor structure. The insulating film 11 may be an oxide film such as borophosphosilicate glass (BPSG), a nitride film or the like. A photoresist mask having an opening at the position corresponding to the MNOS capacitor structure is formed, and the insulating film 11 exposed in the opening is selectively etched and removed to form a contact hole.

After the contact hole is formed in the insulating film 11, the substrate is annealed, for example, for 30 minutes at about 400° C. in an O$_2$/N$_2$ atmosphere in order to avoid any influence of the etching process. If the flat band voltage of the MNOS capacitor shifts by the etching process for the MNOS capacitor structure and by the etching process for the contact hole through the insulating film 11, this shift can be removed by annealing. Therefore, the initial flat band voltage of the MNOS capacitor structure may be measured after this annealing, by the C-V measurements.

The above annealing processes may be omitted if the MNOS capacitor structure and the contact hole through the insulating film 11 are formed by a process without no charging damage, for example, by a wet etching process.

Thereafter, a metal antenna layer 12 is deposited over the surface of the Si substrate 1. The antenna layer 12 may be a single metal layer such as Al alloy or a laminated layer of a plurality of different metal layers. The antenna layer 12 has electrical connection to the upper electrode 5 of the MNOS capacitor structure via the contact hole in the insulating film 11. In the measurement sample to be described later, an Al—Si—Cu alloy layer of 1 μm thick was deposited as the antenna layer 12.

In the above description, the initial flat band voltage is measured after the electrode 5 and nitride film 4 are patterned and/or after the contact hole is formed through the insulating film 11. The initial flat band voltage may be measured after the antenna layer is deposited and the annealing similar to the above is performed. The initial flat band voltage may be measured after at any process stage if influences of preceding processes upon the MNOS capacitor structure can be removed.

After the antenna layer 12 is deposited, a resist mask pattern is formed on the surface of the antenna layer 12 by photolithography.

FIG. 3B is a schematic plan view of the resist mask pattern 13. A dummy pattern AT of a line and space (L & S) type having a plurality of parallel stripes is disposed around the MNOS capacitor structure.

A plurality of parallel stripe patterns 13b1 are disposed above and under a separated pattern 13a over the MNOS capacitor structure C in the horizontal direction (X-direction) in FIG. 3B, and in the vertical direction (Y-direction) a plurality of parallel stripe patterns 13b2 are disposed on the right and left sides of the separated pattern 13a. The separated pattern 13a is surrounded with a loop opening defined by spaces 14a disposed in the vertical directions and spaces 15a disposed in the horizontal direction, and is mechanically and electrically separated from the parallel straight patterns 13b1 and 13b2 in the horizontal and vertical directions. Openings of the dummy pattern AT include the loop opening formed of the spaces 14a and 15a, and further include straight spaces 14b disposed in the vertical direction and communicating with the loop opening.

The dummy pattern AT has a gap G of about 0.5 μm wide and a stripe W of about 1 mm wide alternately disposed. In the measurement sample, 100 lines having a width of 1 μm and a length of 500 μm were disposed at an interval of 0.5 μm in the X-direction, and 100 lines having a width of 1 μm and a length of 2000 μm were disposed at an interval of 0.5 μm in the Y-direction. The aspect ratio of the resist mask pattern 13 can be set to various values, for example, by changing the thickness of the resist pattern mask 13. A dry etching process to be actually used is then performed by using the measurement sample prepared in the above manner.

Figure 5:
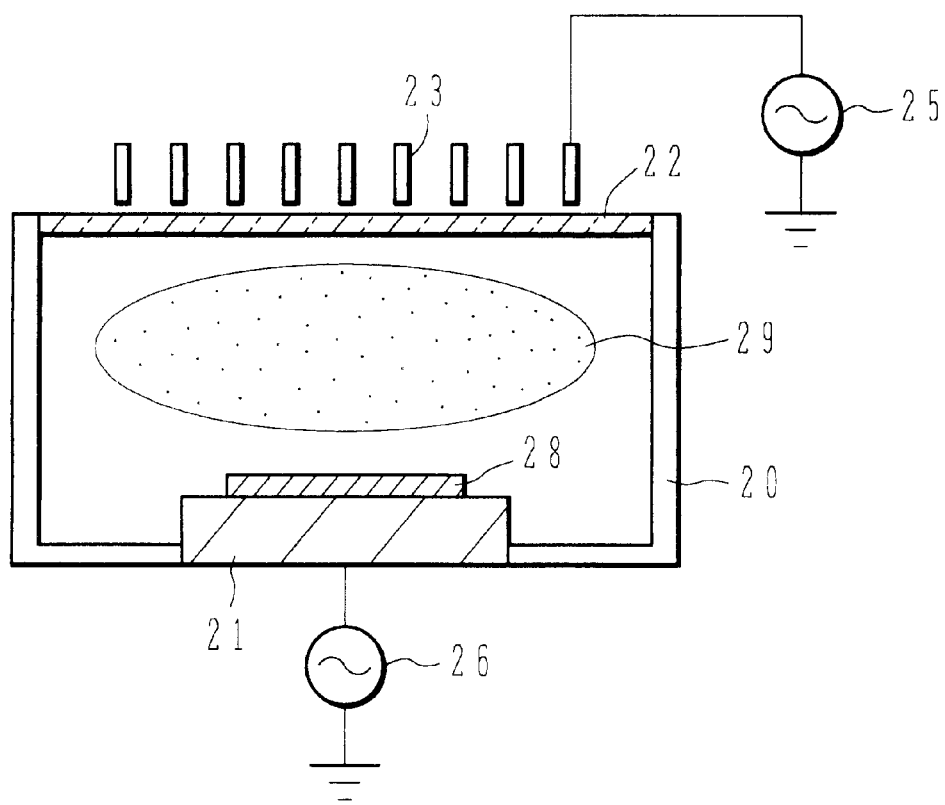
FIG. 5 is a cross sectional view briefly showing the structure of a plasma etching system used by a method of measuring electron shading damages.

FIG. 5 is a schematic diagram showing the structure of an inductively coupled plasma processing system which is a typical example of a dry etching system now in concern. On the bottom of a vacuum chamber 20, a bottom electrode 21 is disposed. A window 22 of dielectric material is formed at the top of the vacuum chamber 20, and an induction coil 23 is disposed over the dielectric window 22. A radio frequency power source at a frequency of, for example, 13.56 MHz is connected to the induction coil 23. Another radio frequency power source at a frequency of, for example, 13.56 MHz is connected to the bottom electrode 21. A radio frequency power supplied to the induction coil 23 is represented by $RF_{top}$ and that supplied to the bottom electrode 21 is represented by $RF_{bot}$.

A measurement sample 28 having the structure such as shown in FIGS. 3A and 3B is placed on the bottom electrode 21, process gas is introduced into the vacuum chamber 20, and the radio frequency power is supplied from the power sources 25 and 26. Plasma 29 is therefore generated in the vacuum chamber 20. The antenna layer 12 exposed in the openings of the resist pattern 13 is etched with plasma 29.

If each opening of the resist mask pattern 13 is narrow and the aspect ratio is high to some degree, the electron shading effects occur although these effects depend on the etching process conditions. The electron shading effects produce the micro loading effects during etching. As positive charges are injected into the antenna layer 12 more than negative charges because of the electron shading effects, tunneling current flows through the MNOS capacitor structure. The charges injected into the MNOS capacitor structure shift the flat band voltage.

Four etching processes were performed by using different etching gas compositions under the following conditions. Flow rate of a gas is represented by angled parentheses sandwiching the gas.

Condition 1 (Prior Art)
Main etch: Pressure 10 mTorr, $RF_{top}$=350 W, $RF_{bot}$=130 W [$Cl_2$]/[$BCl_3$]/[$CHF_3$]=60/60/6 sccm
Over etch: Pressure 10 mTorr, $RF_{top}$=450 W, $RF_{bot}$=100 W [$Cl_2$]/[$BCl_3$]=30/50 sccm Condition 2 (Embodiment)
Main etch: Pressure 10 mTorr, $RF_{top}$=350 W, $RF_{bot}$=130 W [$Cl_2$]/[$BCl_3$]/[$CHF_3$]=60/60/6 sccm
Over etch: Pressure 10 mTorr, $RF_{top}$=450 W, $RF_{bot}$=100 W [HCl]/[He]=80/50 sccm Condition 3 (Reference)
Main etch: Pressure 10 mTorr, $RF_{top}$=350 W, $RF_{bot}$=130 W [$Cl_2$]/[$BCl_3$]/[$CHF_3$]=60/60/6 sccm
Over etch: Pressure 10 mTorr, $RF_{top}$=450 W, $RF_{bot}$=100 W [$Cl_2$]/[HCl]=30/50 sccm Condition 4
Main etch: Pressure 10 mTorr, $RF_{top}$=350 W, $RF_{bot}$=130 W [$Cl_2$]/[$BCl_3$]/[$CHF_3$]=60/60/6 sccm
Over etch: Pressure 10 mTorr, $RF_{top}$=450 W, $RF_{bot}$=100 W [HCl]=80 sccm In order to measure the changed flat band voltage, the residual resist mask pattern 13 was etched with chemicals. In this case, if dry etching is used, the flat band voltage may further change so that it becomes difficult to measure a flat band voltage shift caused only by the dry process in concern.

FIG. 3C shows the structure of the sample after the resist mask pattern 13 is removed after the dry process. In this state, a flat band voltage of the MNOS capacitor is measured again by a C-V method.

The flat band voltage shift amount $\Delta V_{fb}$ is obtained from a difference between the flat band voltage measured after the dry process and the initial flat band voltage. By referring to the characteristic curve shown in FIG. 2C using the obtained flat band voltage shift amount $\Delta V_{fb}$ as an index, the amount Q of charges injected into the MNOS capacitor structure is obtained. In the above manner, the charge amount (electron shading damages) injected by the electron shading effects can be estimated.

The degree of electron shading effects dependent upon the etching conditions can be known through comparison between the injected charge amounts during the etching under Conditions 1 and 2.

In order to raise a measurement precision, it is preferable to make the antenna area exposed in the openings of the resist mask pattern broader than the area of the MNOS capacitor structure. For example, the antenna area is set to 0.25 mm$^2$ which is a 25-fold of the capacitor area. In this case, the total length of the antenna is about 250 mm. The length of the periphery is about twice this amount.

If the charging damages only caused by the electron shading effects are to be measured, it is preferable to remove influence not caused by the electron shading effects as much as possible. For example, if plasma itself is not uniform, charges are injected not only in the area of the resist mask pattern opening having a high aspect ratio, but also in the broadly exposed area. In order to avoid such influence, it is preferable to use a measurement sample as well as a reference sample.

Figure 4A:
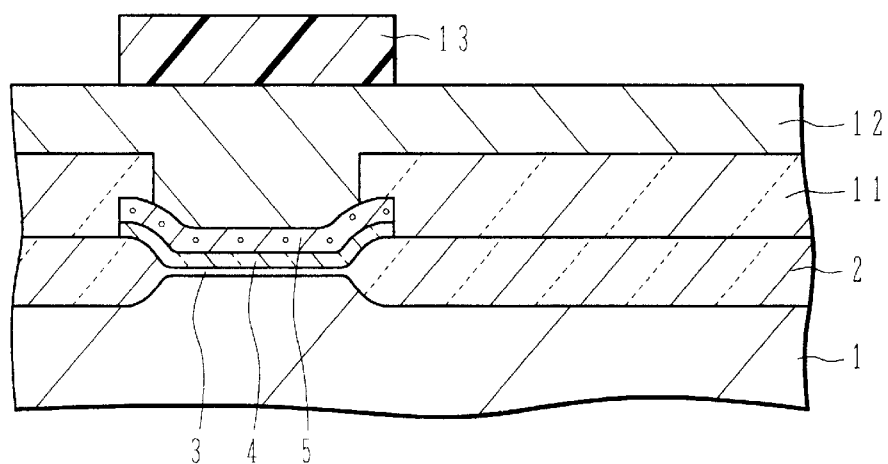
Figure 4B:
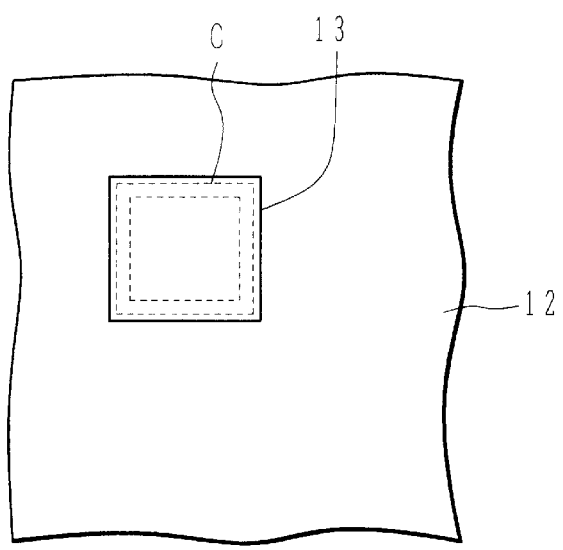
Figure 4C:
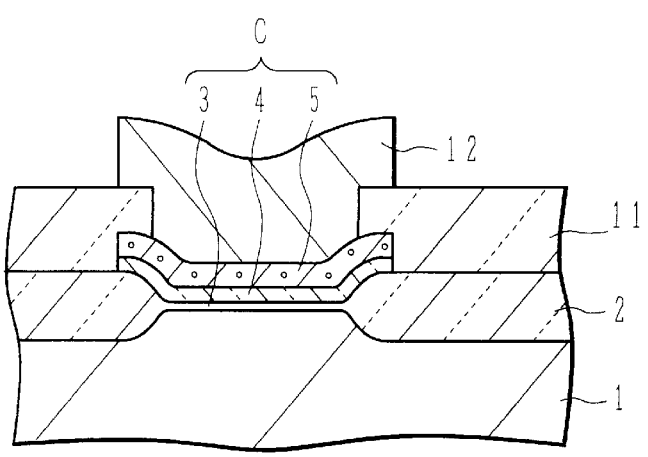

FIGS. 4A to 4C show the structure of a reference sample. FIGS. 4A and 4B are a cross sectional view and a plan view of the reference sample before the dry process.

As compared to the structure shown in FIGS. 3A and 3B, the different point is only in the layout of the resist mask pattern 13. The reference sample is not provided with the dummy pattern shown in FIGS. 3A and 3B. The resist pattern 13 is rectangular and has the same area as that of the resist mask pattern 13 of the measurement sample shown in FIGS. 3A and 3B. With such a rectangular resist mask pattern, the electron shading effects hardly occur. Therefore, if there is different influence not caused by the electron shading effects, the degree of this influence can be measured by using the reference sample shown in FIGS. 4A and 4B.

Similar to the sample shown in FIGS. 3A and 3B, the initial flat band voltage of the sample shown in FIGS. 4A and 4B is first measured. After the processes similar to those performed for the sample shown in FIGS. 3A and 3B, the resist mask pattern 13 is removed to obtain the structure shown in FIG. 4C. By using this sample, the flat band voltage is measured by the C-V method in the manner similar to the sample shown in FIG. 3C.

The flat band voltage shift of the sample shown in FIGS. 4A to 4C is subtracted from that of the sample shown in FIGS. 3A to 3C. This obtained value is the flat band voltage shift caused by the charging damages of only the electron shading effects.

Conditions 1, 2, 3 and 4 of the etching processes were compared and the results are given in the following Table 1, wherein a value obtained by subtracting the flat band voltage shift of the reference sample with the rectangular pattern from that of the measurement sample with the dummy pattern is defined as the flat band voltage shift.

TABLE 1

| Over etching gas | Flat band voltage shift (V) by electron shading damages |
|---|---|
| Cl$_2$/BCl$_3$ (Condition 1 Prior Art) | 2.40 |
| HCl/He (Condition 2) | 1.76 |
| Cl$_2$/HCl (Condition 3) | 2.11 |

TABLE 1-continued

| Over etching gas | Flat band voltage shift (V) by electron shading damages |
|---|---|
| HCl (Condition 4) | 1.97 |

Figure 9:
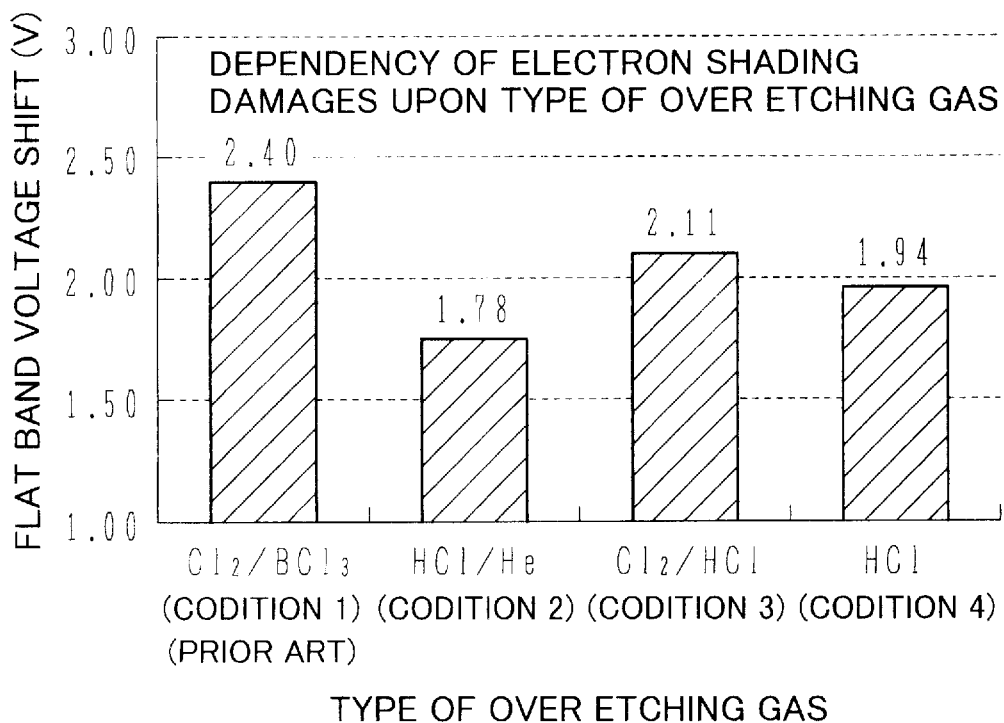
FIG. 9 is a graph showing a flat band voltage shift difference between different types of over etching gas.

These comparison results are graphically shown in FIG. 9.

The following points can be understood from the above comparison results.

Condition 2 with a small average molecular weight of gas used for over etching gives less electron shading damages than Condition 1 (Condition 1 vs Condition 2).

The electron shading damages are reduced even if the composition BCl$_3$ only of etching gas of Condition 1 is replaced by HCl (Condition 3) having a smaller molecular weight.

The electron shading damages are reduced further by adding He.

Etching with an opening pattern having a high aspect ratio has another problem of an abnormal shape called "notch" of an etched layer, in addition to the electron shading damages. It has been verified that the etching conditions not forming a notch produce less electron shading damages.

Figure 6:
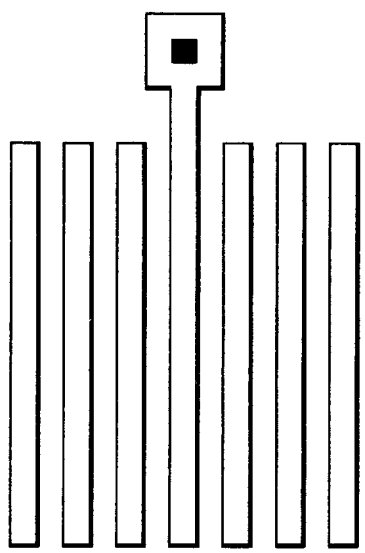
FIG. 6 is a plan view of a pattern used when measuring a notch amount.

FIG. 6 is a plan view of a test pattern used for notch evaluation. Line patterns each having a width of 1.0 μm and a length of 500 μm are disposed parallel at an interval of 0.8 μm, and a single line disposed at the center is electrically connected via a contact hole to a p-type Si substrate. A notch is likely to be formed at a line electrically connected to the substrate. Therefore, notch observations were made relative to this line electrically connected to the substrate. The wiring layer structure was TiN/AlSiCu=40/1000 nm and the resist film thickness was 1.9 μm.

Figure 7:
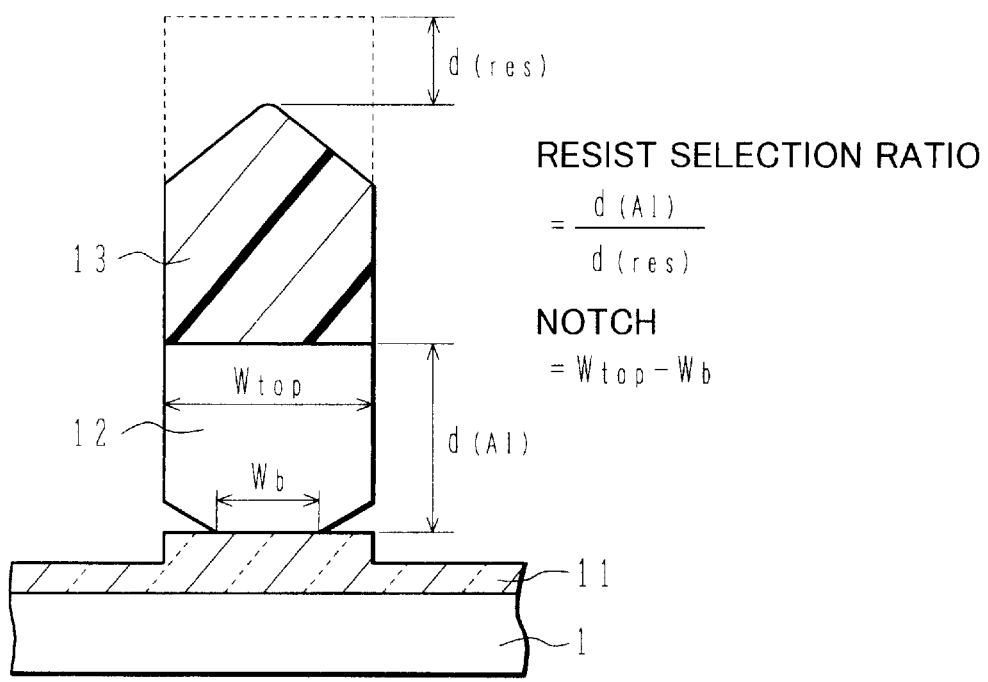
FIG. 7 is a schematic plan view illustrating the definition of a notch amount.

FIG. 7 is a schematic cross sectional view illustrating the definition of a notch amount, which shows the structure after etching by using a resist pattern. A Si substrate 1 has an insulating film 11 formed thereon on which a wiring layer 12 is formed. A resist pattern 13 is left on the wiring layer 12. An etching selection ratio is defined by d(Al)/d(res) wherein d(res) is a height of resist lowered by the etching and d(Al) is a thickness of the etched wiring layer 12. The width of the top of the etched wiring layer 12 is represented by W$_{top}$, and the width of the wiring layer at the notched narrowest portion is represented by W$_b$. The notch amount is defined as W$_{top}$-W$_b$.

As the etching system, an inductively coupled plasma etcher such as shown in FIG. 5 was used. The main etching conditions were fixed to the etching gas of Cl$_2$/BCl$_3$/CHF$_3$ and the over etching conditions were changed as shown in Table 1. The over etching time was set to such a value that the etching amount of an Al—Si—Cu wiring layer becomes 656 nm. The measurement results are shown in Table 2. In this Table, the "Pressure" is a pressure in the etcher chamber, and "$RF_{top}$" and "$RF_{bot}$" are RF powers supplied to the upper induction coil and bottom electrode. The amount of each etchant gas composition supplied to the etcher is indicated by a flow rate (sccm). "Average molecular weight" is an average weight of all compositions of each etchant gas. "Notch amount" and "Resist selection ratio" indicate the values defined as above.

TABLE 2

|  | No. 1 | No. 2 | No. 3 | No. 4 | No. 5 | No. 6 |
|---|---|---|---|---|---|---|
| Pressure (mTorr) | 10 | 10 | 10 | 10 | 10 | 10 |
| $RF_{top}$ (W) | 450 | 450 | 450 | 450 | 450 | 450 |
| $RF_{bot}$ (W) | 100 | 100 | 100 | 100 | 100 | 100 |
| $Cl_2$ (sccm) |  |  |  | 30 | 30 | 30 |
| $BCl_3$ (sccm) |  |  |  | 50 | 50 | 50 |
| HCl (sccm) | 80 | 80 | 80 |  |  |  |
| He (sccm) |  | 100 |  | 100 |  |  |
| Ar (sccm) |  |  | 100 |  |  | 100 |
| Average Molecular Weight | 36.5 | 18.4 | 38.4 | 46.6 | 100 | 66.6 |
| Notch Amount ($\mu$m) | 0.206 | 0.043 | 0.078 | 0.200 | 0.304 | 0.272 |
| Resist Selection Ratio (@ 1 $\mu$m line) | 2.04 | 2.04 | 2.04 | 1.09 | 1.35 | 1.22 |

The main etching was performed under the conditions of a pressure of 10 mTorr, $RF_{top}$=350 W, $RF_{bot}$=130 W, $Cl_2$/$BCl_3$/$CHF_3$=60/60/6 sccm.

As compared with the results of the prior art No. 5, the notch amounts of other etchings are improved.

(1) As seen from comparison between Nos. 4, 5 and 6, the notch amount is reduced by diluting $Cl_2$/$BCl_3$ with He or Ar.

(2) As seen from comparison between Nos. 5 and 1, the notch amount is reduced more and the resist selection ratio is raised more by using HCl containing etching gas than by using $Cl_2$/$BCl_3$ containing etching gas.

(3) As seen from comparison between Nos. 4 and 2 and between Nos. 6 and 3, if inert gas such as He and Ar is mixed, the notch amount is reduced more and the resist selection ratio is raised more by using main etching gas HCl than by main etching gas $Cl_2$/$BCl_3$.

(4) As seen from comparison between Nos. 2 and 3 and between Nos. 4 and 6, the notch amount is reduced more by adding He than by adding Ar.

It is conceivable that an electron temperature is relevant to electron shading damages and abnormal shapes such as notch. The electron temperature is determined from an energy the electron obtains from an electric field while it flies by a distance of a mean free path and from an energy lost when it collides with a gas molecule. It is known that the following relationship (2) is established between an electron temperature Te, an electric field E, a gas molecule mass $m_m$, an electron mass $m_e$, and an electron mean free path $\lambda_e$.

$$Te \propto (m_m/m_e)^{1/2} \cdot \lambda_e E \quad (2)$$

According to the relationship (2), it can be known that the electron temperature can be lowered as gas having a smaller molecular weight is used. It can be expected that at a lower electron temperature, the electron shading damages and notch can be reduced.

From the above teaching, it can be expected that in the case of a mixed gas, the electron temperature can be lowered if its average molecular weight is lowered. For Cl containing etching gas, HCl has a smaller molecular weight than $CL_2$, $BCl_3$ or the like and is more effective for lowering the electron temperature. The average molecular weight can be reduced by mixing gas having a small atomic (molecular) weight and not hindering etching. Such additive gas may be rare gas such as He, Ar and Ne, and $H_2$ and the like. The above experiment results support such concept.

Figure 8:
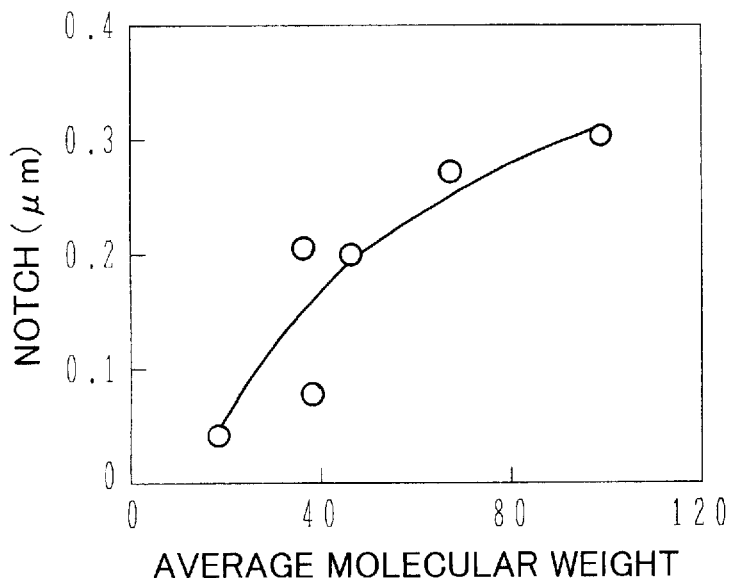
FIG. 8 is a graph showing the relationship between an average molecular weight and a notch amount.

FIG. 8 is a graph showing the relationship between a notch amount and an average molecular weight. The abscissa represents an average molecular weight of etching gas and the ordinate represents a notch amount. The notch amount has apparently a tendency to reduce as the average molecular weight reduces.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:

forming a conductive layer on a semiconductor substrate, the conductive layer being made of aluminum or aluminum alloy;

forming a resist pattern on the conductive layer, the resist pattern having an opening pattern including a first space having a first aspect ratio greater than 1 and a second space having a second aspect ratio equal to or less than 1;

main etching by dry-etching the conductive layer, using the resist mask as an etching mask, wherein the conductive layer is almost etched in the second space having the second aspect ratio and not fully etched in the first space having the first aspect ratio; and over etching by further dry-etching the conductive layer, using the resist mask as an etching mask and using an etchant comprising a mixed gas of HCl gas and at least one species of gas selected from the group consisting of He, Ar, Ne and $H_2$.

2. A method according to claim 1, wherein said over etching step uses an etchant containing He or Ar.

3. A method according to claim 1, wherein said main etching step uses $Cl_2$ containing etchant gas.

4. A method according to claim 3 wherein said over etching step uses an etchant containing He or Ar.

5. A method according to claim 1, wherein said main etching step uses $BCl_3$ containing etchant gas.

6. A method according to claim 5, wherein said over etching step uses an etchant containing He or Ar.

7. A method according to claim 1, wherein said main etching step uses $CHF_3$ containing etchant gas.

8. A method according to claim 7, wherein said over etching step uses an etchant containing He or Ar.

9. A method according to claim 1, wherein said main etching step uses $Cl_2/BCl_3/CHF_3$ containing etchant gas.

10. A method according to claim 9, wherein said over etching step uses an etchant containing He or Ar.

11. A method of manufacturing a semiconductor device comprising the steps of:

forming a conductive layer on a semiconductor substrate, the conductive layer being made of aluminum or aluminum alloy;

forming a resist pattern on the conductive layer, the resist pattern having an opening pattern including a first space having a first aspect ratio and a second space having a second aspect ratio, the first aspect ratio being larger than the second aspect ratio;

main etching by dry-etching the conductive layer, using the resist mask as an etching mask, wherein the conductive layer is almost etched in the second space having the second aspect ratio and not fully etched in the first space having the first aspect ratio; and over etching by further dry-etching the conductive layer, using the resist mask as an etching mask and using an etchant comprising a mixed gas of HCl gas and at least one species of gas selected from the group consisting of He, Ar, Ne and $H_2$.

* * * * *